(12) United States Patent
Tu et al.

(10) Patent No.: US 7,099,194 B2
(45) Date of Patent: Aug. 29, 2006

(54) ERROR RECOVERY FOR NONVOLATILE MEMORY

(75) Inventors: Loc Tu, San Jose, CA (US); Jian Chen, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/003,545

(22) Filed: Dec. 3, 2004

(65) Prior Publication Data

US 2005/0094440 A1    May 5, 2005

Related U.S. Application Data

(63) Continuation of application No. 10/318,621, filed on Dec. 12, 2002, now Pat. No. 6,829,167.

(51) Int. Cl.
*G11C 16/04* (2006.01)

(52) U.S. Cl. ............................ 365/185.18; 365/185.21; 365/185.29

(58) Field of Classification Search ........... 365/185.18, 365/185.09, 185.24, 185.22, 185.29
See application file for complete search history.

(56) References Cited

U.S. PATENT DOCUMENTS

| 5,095,344 A | 3/1992 | Harari |
| 5,270,979 A | 12/1993 | Harari et al. |
| 5,297,148 A | 3/1994 | Harari et al. |
| 5,321,699 A | 6/1994 | Endoh et al. |
| 5,380,672 A | 1/1995 | Yuan et al. |
| 5,430,859 A | 7/1995 | Norman et al. |
| 5,532,962 A | 7/1996 | Auclair et al. |
| 5,602,789 A | 2/1997 | Endoh et al. |
| 5,602,987 A | 2/1997 | Harari et al. |
| 5,657,332 A | 8/1997 | Auclair et al. |
| 5,663,901 A | 9/1997 | Wallace et al. |
| 5,712,180 A | 1/1998 | Guterman et al. |
| 5,867,429 A | 2/1999 | Chen et al. |
| 5,887,145 A | 3/1999 | Harari et al. |
| 5,991,517 A | 11/1999 | Harari et al. |
| 6,222,762 B1 | 4/2001 | Guterman et al. |
| 6,230,233 B1 | 5/2001 | Lofgren et al. |
| 6,266,273 B1 | 7/2001 | Conley et al. |
| 6,522,580 B1 | 2/2003 | Chen et al. |
| 6,542,407 B1 | 4/2003 | Chen et al. |
| 6,560,143 B1 | 5/2003 | Conley et al. |
| 6,829,167 B1 | 12/2004 | Tu et al. |

OTHER PUBLICATIONS

Lee, Jae-Duk et al., "Effects of Parasitic Capacitance on NAND Flash Memory Cell Operation," IEEE Non-Volatile Semiconductor Memory Workshop, Aug. 12-16, 2001, Monterey, California, cover and pp. 90-92.
EPO/ISA, "Notification of Transmittal of the International Search Report or the Declaration", mailed in related PCT/US03/39271 on Jun. 9, 2004, 6 pages.

*Primary Examiner*—Richard Elms
*Assistant Examiner*—Hien N Nguyen
(74) *Attorney, Agent, or Firm*—Parsons Hsue & de Runtz LLP

(57) ABSTRACT

An error recovery technique is used on marginal nonvolatile memory cells. A marginal memory cell is unreadable because it has a voltage threshold (VT) of less than zero volts. By biasing adjacent memory cells, this will shift the voltage threshold of the marginal memory cells, so that it is a positive value. Then the VT of the marginal memory cell can be determined. The technique is applicable to both binary and multistate memory cells.

9 Claims, 5 Drawing Sheets

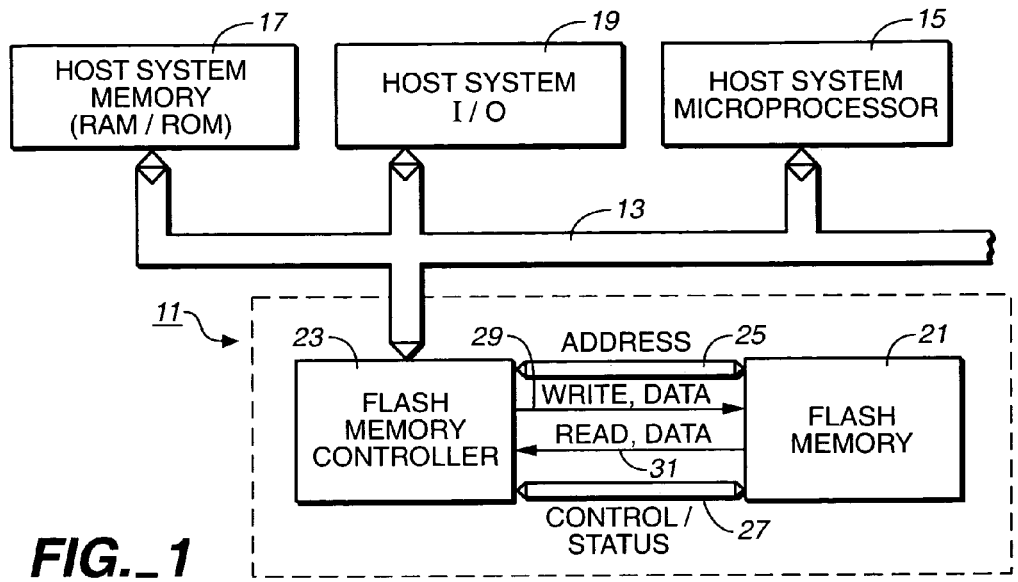
FIG._1
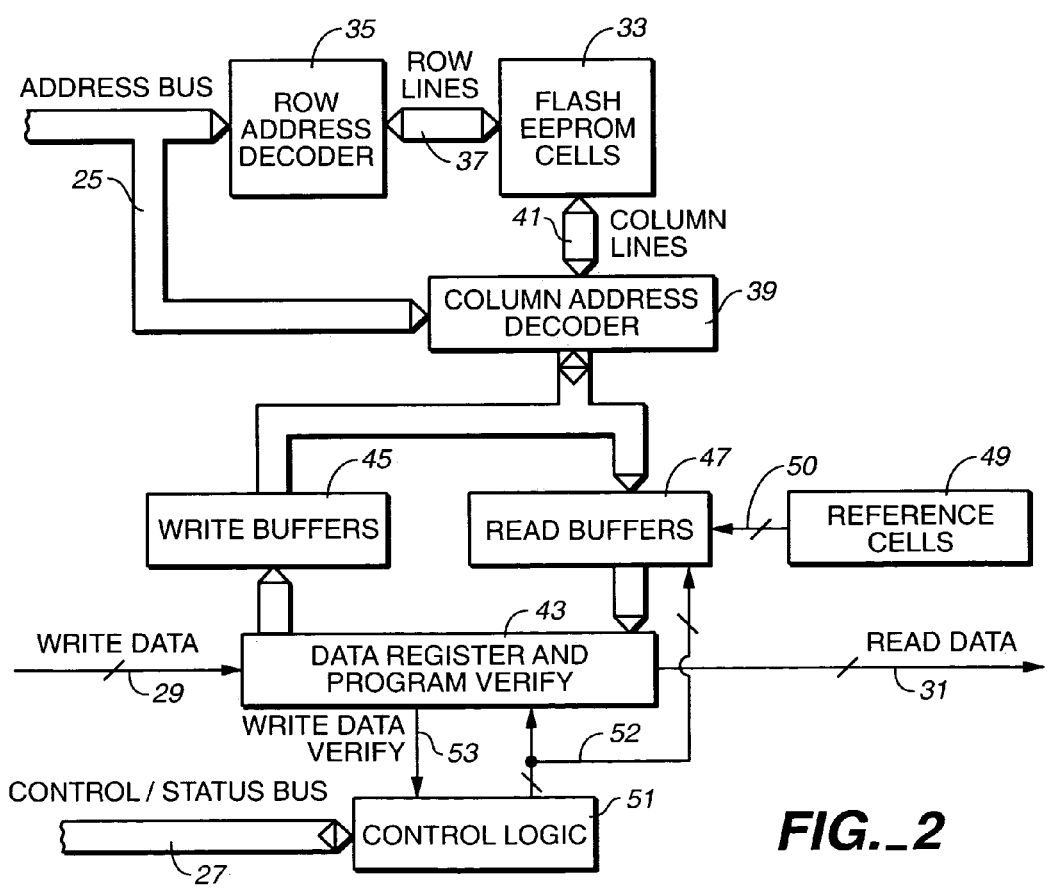
FIG._2

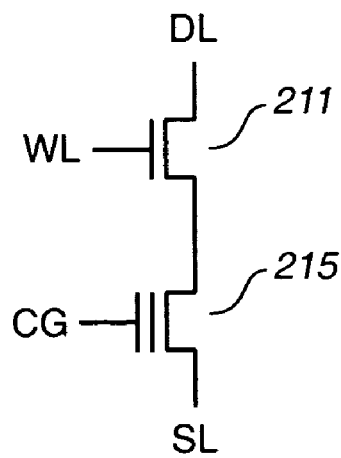
FIG._3
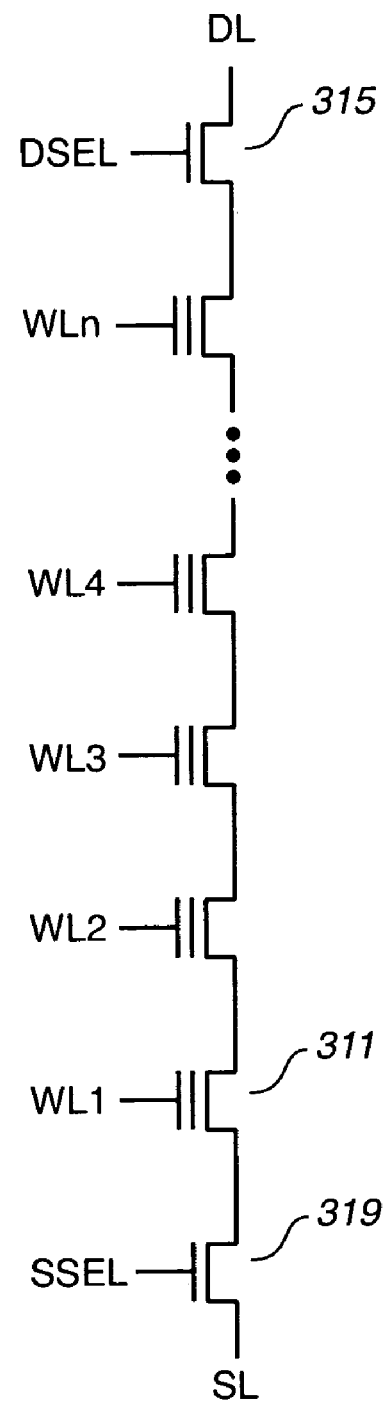
FIG._4

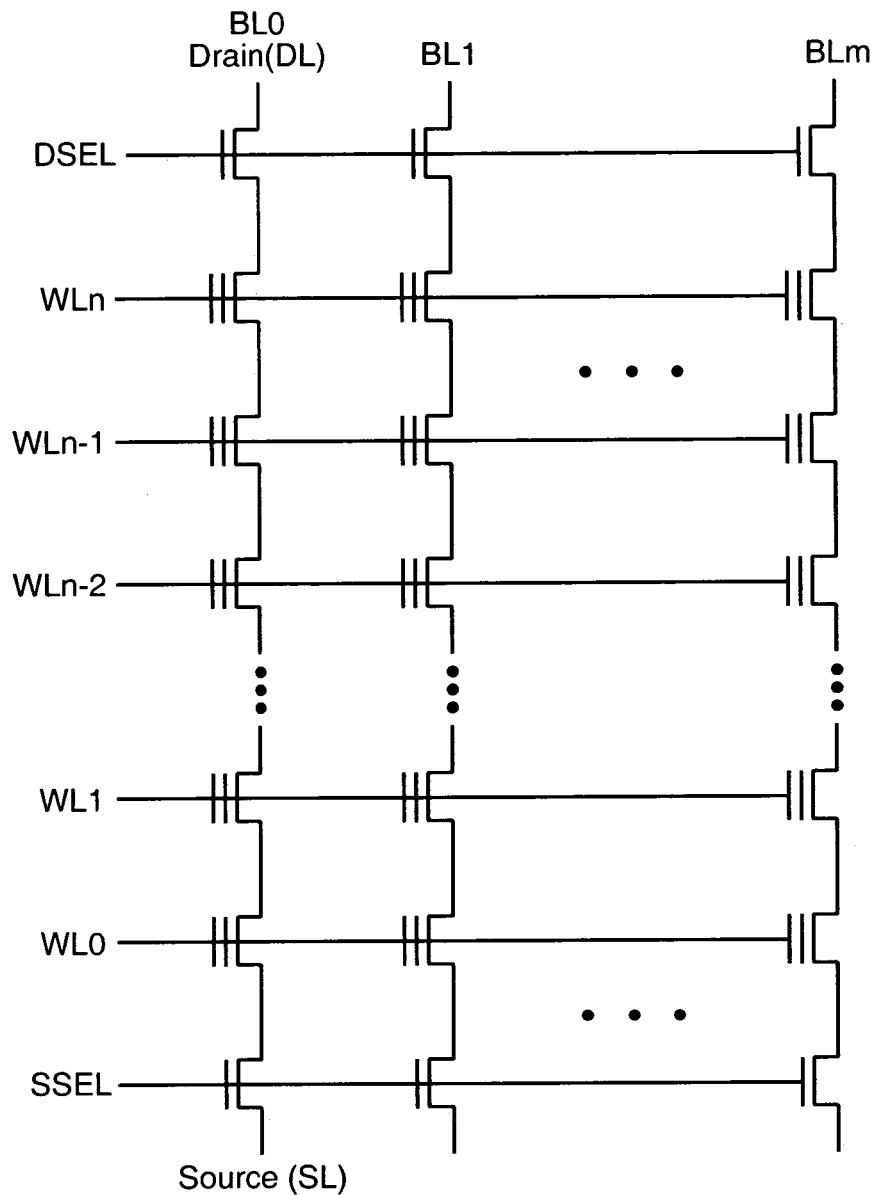
FIG._5
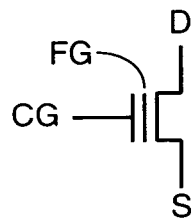
FIG._6

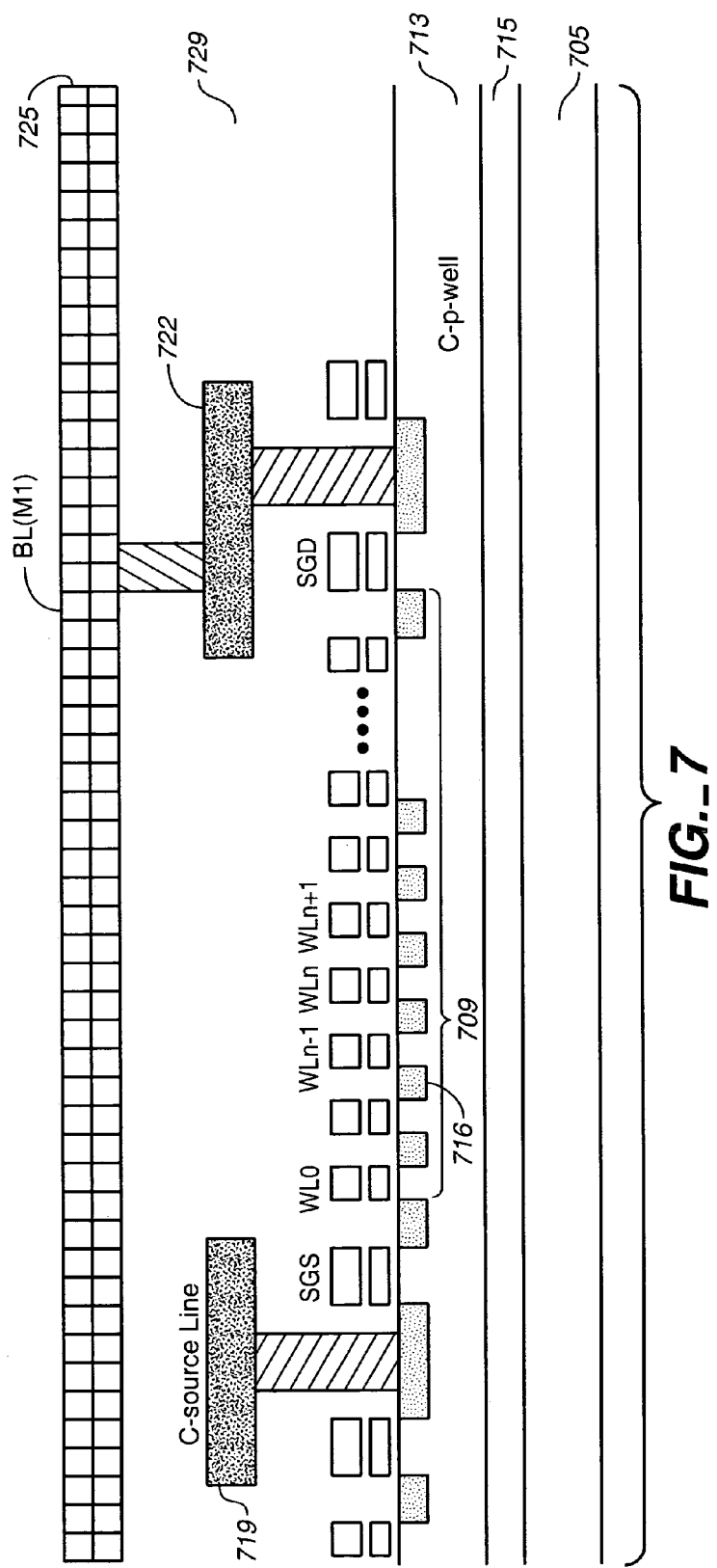
FIG._7

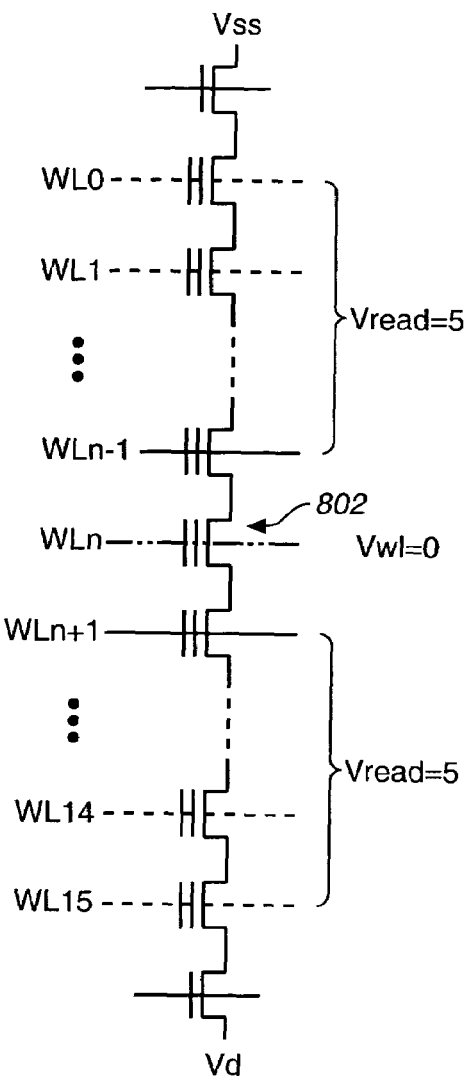
FIG._8
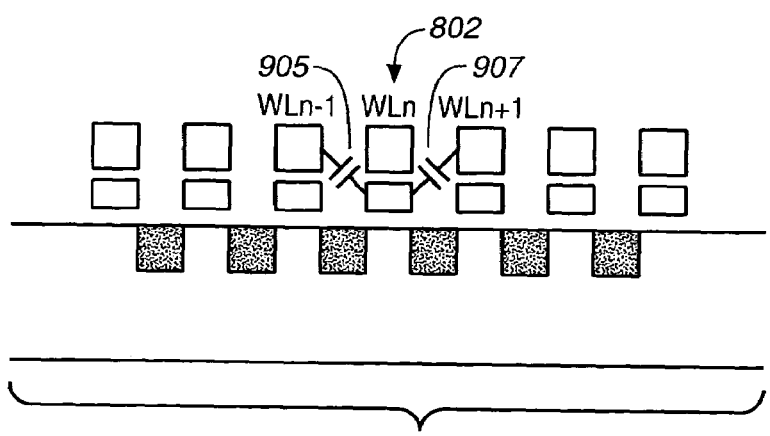
FIG._9

ERROR RECOVERY FOR NONVOLATILE MEMORY

CROSS-REFERENCE TO RELATED APPLICATION

This application is a continuation of application Ser. No. 10/318,621, filed Dec. 12, 2002 now U.S. Pat. No. 6,829,167, which application is incorporated herein in its entirety by this reference.

BACKGROUND OF THE INVENTION

The present invention relates to programming of nonvolatile erasable programmable memories and more specifically, a technique to recover data from unreadable nonvolatile memory cells, which will increase the reliability and longevity of the memory cells.

Memory and storage is one of the key technology areas that is enabling the growth in the information age. With the rapid growth in the Internet, World Wide Web (WWW), wireless phones, personal digital assistants (PDAs), digital cameras, digital camcorders, digital music players, computers, networks, and more, there is continually a need for better memory and storage technology.

A particular type of memory is the nonvolatile memory. A nonvolatile memory retains its memory or stored state even when power is removed. Some types of nonvolatile erasable programmable memories include Flash, EEPROM, EPROM, MRAM, FRAM, ferroelectric, and magnetic memories. Some nonvolatile storage products include Flash disk drives, CompactFlash™ (CF) cards, MultiMedia cards (MMC), secure digital (SD) cards, Flash PC cards (e.g., ATA Flash cards), SmartMedia cards, personal tags (P-Tag), and memory sticks.

A widely used type of semiconductor memory storage cell is the Flash memory cell. Some types of floating gate memory cells include Flash, EEPROM, and EPROM. There are other types of memory cell technologies such as those mentioned above. Floating gate memory cells such as Flash are discussed as merely an example. The discussion in this application would also apply to other memory technologies other than floating gate technology with the appropriate modifications.

Memory cells are configured or programmed to a desired configured state. In particular, electric charge is placed on or removed from the floating gate of a Flash memory cell to put the cell into two or more stored states. One state is a programmed state and another state is an erased state. A Flash memory cell can be used to represent at least two binary states, a 0 or a 1. A Flash memory cell can also store more than two binary states, such as a 00, 01, 10, or 11. This cell can store multiple states and may be referred to as a multistate memory cell, a multilevel, or multibit memory cell. This allows the manufacture of higher density memories without increasing the number of memory cells since each memory cell can represent more than a single bit. The cell may have more than one programmed state. For example, for a memory cell capable of representing two bits, there will be three programmed states and an erased state.

Despite the success of nonvolatile memories, there also continues to be a need to improve the technology. It is desirable to improve the density, performance, speed, durability, and reliability of these memories. It is also desirable to reduce power consumption and reduce the cost per bit of storage. One aspect of nonvolatile memories is the techniques used to recover data from memory cells which are unreadable or marginally readable.

As can be appreciated, there is a need for improving the circuitry and techniques for operating on memory cells.

BRIEF SUMMARY OF THE INVENTION

The invention is an error recovery technique used on marginal nonvolatile memory cells. A marginal memory cell is unreadable because it has a voltage threshold (VT) of less than zero volts. By biasing adjacent memory cells, this will shift the voltage threshold of the marginal memory cells, so that it is a positive value. Then the VT of the marginal memory cell can be determined. The technique is applicable to both binary and multistate memory cells.

During a typical or standard read mode, the adjacent memory cells are biased using a first VREAD voltage on their word lines. However, when it is desirable to recover data from a marginal memory cell in a recovery read mode, a second VREAD voltage is applied on the word lines of adjacent memory cells. This second VREAD voltage different from the first VREAD voltage. To shift the VT down, the second VREAD voltage is above the first VREAD voltage. Using the biasing technique, the VT may also be shifted up by using a VREAD voltage less than the first VREAD voltage. Depending on the magnitude of the difference between the first and second VREAD voltages, it will be possible to determine how much the VT of the marginal memory cell was shifted up, so the value of VT will be known. Then, the data stored in the marginal memory cell will be known.

This technology is based on a principle of adjacent word line (WL) coupling to floating gate (FG) effect. In previous generations of technologies, due to larger features and spacing, this coupling was negligible. The invention takes advantage of this coupling, due to scaling, to recover data.

After the data in the marginal memory cell is recovered, the data can be moved to another memory cell, and the marginal memory cell can be mapped so it is not used in the future. In a further embodiment of the invention, if there is a bad memory cell, the whole block where the bad memory cell was found will be moved to another location, and the block will not be used in the future.

In a specific embodiment, the invention is a method of operating a memory integrated circuit including providing a string of memory cells organized in a NAND structure. A first memory cell in the string to read data from is selected. A VWL voltage is placed on a word line of the first memory cell. In an embodiment, VWL is ground. For a memory cell standard read mode, a first VREAD voltage is placed on a word line of a second memory cell, adjacent to the first memory cell. For a memory cell recovery read mode, a second VREAD voltage is placed on the word line of the second memory cell, wherein the second VREAD voltage is different from the first VREAD voltage. Data is read from the first memory cell.

In an embodiment, the second VREAD voltage is above or below the first VREAD voltage. In another embodiment, the second VREAD voltage is below the first VREAD voltage. VWL voltage is about zero volts. In an embodiment, the first VREAD voltage is in a voltage range from about 4 volts to about 5 volts. In another embodiment, the first VREAD voltage is in a voltage range from about 3 volts to 6 volts. In further embodiments, the first VREAD voltage may be less than 3 volts or greater than 6 volts. The second VREAD voltage is at least about 0.25 volts above or below the first VREAD voltage. The technique may further include for the memory cell recovery read mode, placing the second VREAD voltage on a word line of a third memory cell, also adjacent to the first memory cell, wherein the second VREAD voltage is different from the first VREAD voltage. The invention may be implemented using a controller of a storage device.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 1 illustrates a nonvolatile mass storage memory of a type in which the various aspects of the present invention may be utilized, when connected to a host electronic system.

FIG. 2 is a block diagram of the memory block of FIG. 1 in which the present invention is implemented.

FIG. 3 shows a diagram of a NOR Flash cell.

FIG. 4 shows a diagram a string of NAND Flash cells.

FIG. 5 shows an array of NAND memory cells.

FIG. 6 shows a floating gate memory cell.

FIG. 7 shows a cross section of a NAND memory array string.

FIG. 8 shows a circuit diagram of a NAND string of memory cells and one cell to be read or verified.

FIG. 9 shows a cross section of the memory cells of a NAND string and coupling capacitances between a memory cell to be read or verified and adjacent cells in the string.

DETAILED DESCRIPTION OF THE INVENTION

FIG. 1 shows a mass storage memory system 11 in which the various aspects of the present invention are implemented. The mass storage system is connected to a system bus 13 of a host electronic system, such as a computer system. Some examples of electronic systems include computers, laptop computers, handheld computers, palmtop computers, personal digital assistants (PDA), MP3 and other audio players, digital cameras, video cameras, electronic game machines, wireless and wired telephony devices, answering machines, voice recorders, network routers, or any other system that may use a mass storage memory system.

The host electronic system has a bus 13, central processor 15, some volatile memory 17 and a circuit 19 providing connection with input-output devices or circuits. Some examples of input-output devices are keyboards, monitors, modems, and the like. The memory system 11 functionally includes a memory block 21 with an array of Flash memory cells (sometimes referred to as Flash EEPROM cells) and associated decoder and control circuits, and a controller 23. The controller is connected with memory block 21 by way of an address bus 25, a control status bus 27, two-bit (for example) serial write data lines 29, and two-bit (for example) serial read data lines 31. The data lines between the controller and the memory may communicate information in serial or parallel, depending on the implementation.

Both memory block 21 and controller 23 and the rest of the memory system 11 can be implemented on a single integrated circuit. Integrated circuits are sometimes called chips. Alternatively, two or more integrated circuit chips can be used to form memory system 11. For example, controller 23 may be on a dedicated integrated circuit and memory 21 may be on one or more chips, depending on the amount of memory desired. For example, if 1 gigabyte (GB) is desired and 256 megabyte (MB) chips are used, four 256 megabyte chips would be needed.

This electronic system architecture includes a processor or microprocessor 21 connected to a system bus 23, along with random access, main system memory 25, and at least one or more input-output devices 27, such as a keyboard, monitor, modem, and the like.

Examples of volatile memory 17 are dynamic random access memory (DRAM) and static random access memory (SRAM). In contrast to volatile memory, nonvolatile memory retains its stored state even after power is removed from the device. Typically, such a memory is a disk drive using magnetic or optical technology with a capacity of megabytes, gigabytes, or terabytes of data storage. This data is retrieved into the system volatile memory 25 for use in current processing, and can be easily supplemented, changed, or altered.

Memory system 11 is a nonvolatile system. An aspect of the invention is the substitution of a specific type of semiconductor memory system for the disk drive but without having to sacrifice nonvolatility, ease of erasing and rewriting data into the memory, speed of access, low cost, and reliability. This is accomplished by employing one or more electrically erasable programmable read only memories (e.g., Flash or EEPROMs) integrated circuits. This type of memory has additional advantages of requiring less power to operate, and of being lighter in weight than a hard-disk drive magnetic media memory, thus being especially suited for battery-operated portable computers. Memory system 11 can either be permanently built into the computer of its host equipment or can be packaged into a small card that is removably connected to the host. Some examples of nonvolatile semiconductor memories include Flash disk drives, CompactFlash (™) cards, SmartMedia (™) cards, personal tags (P-Tag), multimedia cards, secure digital (SD) cards, and memory sticks (R).

Further discussion of Flash EEPROM systems and nonvolatile cells and storage is discussed in U.S. Pat. No. 5,602,987, U.S. Pat. No. 5,095,344, U.S. Pat. No. 5,270,979, U.S. Pat. No. 5,380,672, U.S. Pat. No. 5,712,180, U.S. Pat. No. 5,991,517, U.S. Pat. No. 6,222,762, and U.S. Pat. No. 6,230,233, which are incorporated by reference along with all other references cited in this application. U.S. Pat. Nos. 5,297,148 and 5,430,859, and pending U.S. patent applications Ser. No. 08/527,254 (U.S. Pat. No. 5,663,901) and Ser. No. 08/781,539 (U.S. Pat. No. 5,887,145) provide background and implementation details of some memory systems in which the various aspects of the present invention may be included. These patents and applications are also incorporated herein by this reference.

A nonvolatile memory system will include a number of memory cells, each of which holds at least one bit of data. Multistate memory cells may also be used, which will allow storage of multiple bits of data in each cell. For example, each memory cell may store two, three, four, five, six, seven, eight, or more bits of data per cell. Memory cells capable of storing multiple bits of data may also be referred to as multilevel cells.

FIG. 2 shows more detail of block 21 of memory system 11. An array 33 of Flash or EEPROM cells is organized into rows and columns. Some types of nonvolatile storage or memory cells are Flash, EEPROM, and EPROM, which are all floating gate type memory cells. Aspects of the invention may also be applied to other types of memories such as phase-change cells, magnetic cells (MRAM), ferroelectric cells (FRAM), magnetic ferroelectric, and many others.

Memory cells are typically arranged in an array in rows and columns, but may be in other configurations. There may be multiple arrays per integrated circuit. Individual cells are accessed by row and column. Two different organizations for the memory cells are NOR and NAND configurations. The invention is applicable to these configurations as well as other configurations of memory cells.

A decoder 35 selects one or more of row (word) lines 37 designated by a portion of an address on the memory system address bus 25. Similarly, a decoder 39 selects one or more of column lines 41 in response to another portion of an address on the address bus 25. The selected row and column lines are energized to specific sets of voltages for reading, programming or erasing the memory cells that are so addressed. These voltages are applied through the row and column address decoders 35 and 39. Typically, the row lines are connected to the control gates of a row of memory cells and the column lines are source/drain diffusions. For programming and reading, a single row line and a number of column lines are simultaneously selected by decoders 35 and 39 for programming or reading a number of cells in parallel.

During programming, the voltages of the selected column lines are set by a chunk of incoming data that is received by data register 43 and temporarily stored in write buffers 45. During reading, currents passing through addressed cells and their column lines are compared in a read buffer circuit 47 with currents in lines 50 that are passed through programmed reference cells 49, the results of that comparison providing the states of the addressed cells that are applied to the data register 43 in a manner to output the read data in lines 31. The program, read and erase operations are controlled by control logic 51 in response to signals on the control/status bus 27. The control logic 51 also receives a signal in a line 53 from the data register 43 that indicates when it has been verified that all bits of a chunk of data have been successfully programmed.

The cell array 33 is typically divided into pages or sectors of cells that are addressable together for simultaneous erasure. According to one implementation, each page also typically includes enough cells to store the same number of bytes of user data as a standard disk drive sector, namely 512 bytes, but may be another size. Each page also includes an additional number of cells to store overhead information related to the page or the user data stored in it, and optionally spare cells, a total of 32 bytes in one implementation. The overhead information is similar to a header to a disk drive data sector.

FIG. 3 shows an example of a nonvolatile memory cell for a NOR configuration. In this specific NOR configuration, there is a select or read transistor 211 connected in series with a memory transistor 215 between a drain line (DL) and source line (SL). The drain line may also sometimes be referred to as a bit line (BL) of the cell. The read transistor has a gate connected to a row line (RL) or word line (WL), and the memory transistor has a control gate connected to a control gate (CG) line. The CG line may be referred to as a control line or steering line. Depending on the particular implementation or operation, the drain line and source line may be interchanged or swapped. In particular, the figure shows the drain line is connected to the read transistor and the source line is connected to the memory transistor. However, in another implementation, the source line may be connected to the read transistor and the drain line may be connected to the memory transistor.

For example, if the word "source" is reserved for that electrode that is at a lower potential than the drain, then during read operations the line that is connected to the drain of the select transistor is the drain line, and the line that is connected to the source of the memory cell transistor is the source line. The situation is reversed for programming, where the higher voltage is applied to the memory cell side to achieve source side injection.

For an array of NOR memory cells, a number of NOR cells will be connected to the drain line (or source line). This will typically be referred to as a column of the array. Each cell of the column will have a separate word line or row line, which will typically referred to as a row of the array.

In an implementation, both read and memory transistors are n-channel or NMOS type transistors. However, the devices may be other types of transistors including p-channel or PMOS type transistors and others. The read device 211 may be a different device type from the memory device 215. In a specific implementation, the memory device is a floating gate device such as a Flash, EEPROM, or EPROM transistor. However, the memory device may be another type of device such as a phase-change, NRAM, FRAM, magnetic ferroelectric, FeRAM, NROM, MNOS, SONOS, or other device.

Alternatively, another embodiment of a NOR memory includes only the memory transistor, and no read transistor. This configuration may be more compact because there is only one transistor per cell instead of two transistors per cell.

FIG. 4 shows nonvolatile memory cells in a NAND configuration. In the NAND configuration, there are a number of memory transistors 311 connected in series between a drain select device 315 and a source select device 319, between a drain line (DL) and source (SL). This is a column of memory cells, and multiple columns of these cells may be used to form an array of NAND memory cells. The column of memory cells is sometimes referred to as a NAND chain or string (or sometimes "block"). In a specific implementation, there are at least sixteen memory cells in a NAND chain. There can be any number of cells per string, such as 8, 32, 48, 64, or more. Each memory transistor has a gate connected to an individual word line (WL). The word lines may be labeled WL1 to WLn, where n is the number of memory cells in a particular column. The drain select device has a gate connected to a drain select line (DSEL), and the source select device has a gate connected to a source select line (SSEL). Depending on the particular implementation, the drain line and source line may be interchanged or swapped.

In an implementation, the source select transistor, drain select transistor, and memory transistors are n-channel or NMOS type transistors. However, the devices may be other types of transistors including p-channel or PMOS type transistors and others. The drain select device and source select device may be a different device type from the memory device 311, and different from each other. In a specific implementation, the memory device is a floating gate device such as a Flash, EEPROM, or EPROM transistor. However, the memory device may be another type of device such as a phase-change, NRAM, FRAM, magnetic ferroelectric, FeRAM, NROM, MNOS, SONOS, or other device.

FIG. 5 shows an array of NAND memory cells. The are n rows and m columns of memory cells, where n and m are positive integers. Each column has n memory cells connected to word lines WL0 to WLn. The columns of memory cells are labeled BL0 to BLn. Each column has n memory cells, which are connected between a drain select device and a source select device. And, the drain and source select devices are in turn connected to the drain line (DL) or bit line (BL) and the source line (SL). Gates of the drain select device are connected to the drain select line (DSEL) and gates of the source select device are connected to the source select line (SSEL). A particular cell or selected cell may be accessed by using the appropriate word line and bit line, and applying the appropriate voltages to those lines.

For example, typically to read a selected memory cell of a NAND string, 0 volts is applied to the word line and control gate of the selected cell, and a VREAD voltage is applied to the word lines and control gates of other memory cells in the NAND string.

FIG. 6 shows a representative floating gate nonvolatile memory device, which may be used in any of the previously described memory cells and arrays. Further description of floating gate devices may be found in U.S. Pat. No. 5,991,517. The floating memory cell has a drain (D), source (S), control gate (CG), and floating gate (FG).

In brief, a nonvolatile memory cell is one that retains its stored state, even when power is removed. Some examples of floating gate type memory cells include Flash, EEPROM (also known as $E^2$ or E-squared), and EPROM. A Flash and EEPROM cell is electrically erasable and electrically programmable. An EPROM cell is electrically programmable, and erasable using ultraviolet (UV) light. A floating gate device is programmed or erased by subjecting appropriate nodes to high voltages. These high voltages cause electrons to be added to or removed from the floating gate, which will adjust the threshold voltage or VT of the floating gate device. Some physical mechanisms for causing electrons to move to or from floating gate are hot-electron injection or Fowler-Nordheim tunneling.

The high voltage used to program the device is sometimes referred to as the VPP voltage, and the high voltage used to erase the device is sometimes referred to as the VEE voltage. The VPP voltage will vary depending on the process technology and the particular implementation. In a particular implementation, VPP ranges from about 6.5 volts to about 20 volts. In some specific implementations, VPP ranges from 12 volts to 18 volts. The VEE voltage will vary depending on the process technology and the particular implementation. In a particular implementation, VEE ranges from about 12 volts to about 25 volts. In some specific implementations, VEE ranges from 12 volts to 15 volts. In some implementation, the programming voltages may be generated by on-chip circuitry, such as charge pumps or other voltage generator circuits, and in other implementations, the programming voltages may be supplied from a voltage source, external to the integrated circuit.

The floating gate nonvolatile memory device may store a single bit (0 or 1) or multiple bits (e.g., two bits: 00, 01, 10, and 11, or three bits: 000, 001, 010, 011, 100, 101, 110, and 111, or four bits: 0000, 0001, 0010, 0011, 0100, 0101, 0110, 0111, 1000, 1001, 1010, 1011, 1100, 1101, 1110, and 1111). U.S. Pat. No. 5,991,517 discusses further some aspects of single bit and multibit (or multistate) cells. In short, the memory cell will have an erased state and one or more programmed states.

An erased state is when the VT of the device is such that it is on for voltages from about ground to VCC. In other words, erase refers to configuring the floating gate device to have a VT (threshold voltage) of, for example, 0 volts or below. When erased, the floating gate transistor conducts current. All the floating gate cells of an integrated circuit may be initialized to an erased state. Furthermore, in an embodiment, the memory cell may need to be erased before it can be programmed.

Erasing occurs by removing electrons from the floating gate of the floating gate transistor. One technique to do this is to ground the control gate and to place the VEE voltage at the drain or the source, or both. The VEE voltage attracts the negatively charged electrons from the floating gate, because they are attracted to the positive voltage. Generally, erasing occurs by the electrons tunneling out of the floating gate. The time it takes to erase the device depends on various factors including the voltage magnitude difference between the control gate and VEE voltage applied to the source or drain. Generally, the greater the voltage difference, the faster the device will become erased because the electrons will be more strongly attracted to the VEE voltage. However, it is desirable that the VEE voltage is selected so that it does not damage the cell and also allows erase of the selected cell, without disturbing the stored states of adjacent and other memory cells (when in an array).

When storing only one bit, the floating gate device will have in addition to the erased state, only one programmed state. For purposes of this application, a programmed state for a single bit cell is typically when the VT of the device is higher than a designated positive value.

For a multistate cell, the VT is set at specific voltage level indicating it is in a particular state. In other words, depending on what the programmed VT state is, this will indicate a particular stored binary value. For an example of a two-bit memory cell, a VT of 1 volt, plus or minus 0.25 volts may indicate a 01 binary state. A VT of 2 volts, plus or minus 0.25 volts, may indicate a 11 binary state. And a VT of 3 volts, plus or minus 0.25 volts, may indicate a 10 binary state. In this example, Gray coding is used so that with state changes, only one bit changes at a time. In other implementations, other coding techniques may be used.

Programming occurs by adding electrons to the floating gate of the floating gate transistor. Generally, one technique to do this is to place VPP at the control gate and to place ground at the drain or the source, or both. The VPP voltage attracts the negatively charged electrons into the floating gate, because they are attracted to the positive voltage.

Using this technique, the electrons tunnel into the floating gate. Generally, another technique is to place the VPP voltage at control gate and cause a current to flow across the floating gate device's channel region (such as placing 6 volts at the drain and grounding the source). Then hot electrons from the current flow will be attracted and become embedded into the floating gate.

More specifically, to program memory cells, there are two mechanisms, tunneling and hot electron injection. For multistate programming, each write operations includes a sequence of program pulses, each of which is followed by a verify operation. Typically the control gate voltage during each programming pulses rises to a higher level than the control gate voltage during the preceding pulse. To increase performance, the first set of pulses may have large step sizes, where a step is the difference between the peak voltage of one pulse and the pick voltage of the preceding pulse. The first set of pulses are in a coarse programming phase. A fine programming phase may start with a step backed first fine programming pulse as compared to the last coarse programming pulse, and the fine programming step size will be substantially smaller than the coarse programming step size. The verify level is the voltage applied to the control gate during each verify phase. The coarse programming verify voltage is smaller than the fine programming verify voltage, so that given the large step size during coarse programming we do not over shoot the final VT target. The fine programming stage's verify voltage depends on the state to which the cell is to be programmed to or in other words is data dependent. Every cell that reaches its fine programming verify voltage is locked out of programming by discontinuing the delivery of a control gate or the bit line voltage, or both, or by raising the cell's programming source voltage to a high enough voltage to inhibit additional programming by taking advantage of the body effect, and the reduced drain to source voltage.

Channel hot electron injection has both hot electron production and hot electron injection. To produce hot electrons a large lateral field in required. This is provided by a high drain to source voltage. To inject the hot electrons onto the floating gate, a large vertical electric field is used. This electric field is provided by the control gate voltage which in turn couples some of its voltage to the floating gate. In drain side injection, the high vertical field needed for hot electron injection has the side effect of reducing the high lateral field needed for hot electron production. Source side injection does not suffer from the same dilemma, and therefore is more efficient. In both source side and drain side injection, a scattering mechanism is required to divert the momentum of electrons traveling laterally through the channel, so that a lucky few will be scattered vertically towards the floating gate. The normal hot electron impingement that is an innovative feature of this cell, may increase the programming efficiency beyond the improved efficiency of source side injection because the majority of hot electrons will have a momentum that will aid them in surmounting the silicon and silicon oxide energy barrier. It will no longer be necessary for the hot electrons to scatter into a direction that would aid them in surmounting the silicon and silicon oxide energy barrier.

Another mechanism for programming would be Fowler-Nordheim tunneling, as is used in NAND technology. But to use tunneling typically entails giving up the potential benefits of the previously discussed mechanism. Tunneling is generally very slow in comparison to hot electron injection. In the case of tunneling, performance has to be maintained by programming larger numbers of cells in parallel at a cost of larger numbers of peripheral programming blocks.

During each programming pulse the drain voltage is maintained at a constant value in a range from about 3 volts to 6 volts. The control gate voltage for the first programming pulse will have some positive starting value that need to be characterized, and may be adaptively determined even in the field. The transfer gate voltage is a constant envisioned to be in a range from about 6 volts to 10 volts. The select gate or word line voltage is envisioned to be in a range from about 3 volts to 10 volts. The select transistor's threshold voltage would preferably be as high as possible so that the operating select gate voltage is as high as possible. This is because the optimum select gate voltage for the most efficient source side injection is less than a volt higher that the select gate threshold voltage. It should be noted that the roles of the two bit lines reverses for the read or verify operation where the adjacent bit line to the floating gate is the source. In this naming convention source is that electrode with a lower voltage as compared to the drain. The source voltage for programming may be adaptively controlled by a current limiter such that the instantaneous programming current does not exceed some designated value.

The movement of charge into and out of the floating gate is determined by an electric field magnitude across the tunneling dielectric (which is the gate oxide between the floating gate and channel region): generally the higher the voltage difference between the control gate or the floating gate and the source, the higher the charge transfer into the floating gate. The time it takes to program the device depends on various factors including the voltage magnitude difference between the VPP voltage on control gate. One should note during the programming, the control gate voltage is not necessarily precisely at VPP. VPP is a constant voltage output of a particular charge pump. However, the control gate voltage may sometimes vary slightly above or below VPP, depending on factors such as the loading on the VPP pump and voltages applied at the source and drain of the device.

Generally, the greater the electric field, the faster the device will become programmed because the electrons will be more strongly attracted to the VPP voltage. However, it is desirable that the maximum programming control gate voltage and the maximum programming drain voltage are selected so that they do not damage the cell and also allow programming of the selected cell, without disturbing the stored states of adjacent and other memory cells (when in an array) on the same control line, bit line, or word line. Further, when the cell is a multistate cell, it may be desirable that the VPP voltage is selected so it allows sufficiently fine resolution in programming the device to the desired VT. For example, the VPP voltage may be applied in pulses so that the devices don't become programmed to too much (i.e., programmed to a VT level above their intended VT level).

Typically, in a binary NAND memory, when a bit is read, the WL voltage on that bit is 0 volts. It is hard wired to 0 volts. And consequently, it is not feasible to detect a bit which has a VT of less than 0 volts. Because negative VTs cannot be measured, this deprives the use of a mode of margin read. As is well known, margin read is extremely useful for ensuring reliability of the memory cells. In a multistate or multilevel (MLC) NAND flash memory, the "10" state is also read with a word line voltage of 0 volts, and similar to that of the binary case, the word line is hardwired to 0 volts. There is no means of detecting or determining bits that have VTs less than 0 volts. For multistate NAND, it is desirable to properly detect the correct margins of the memory cells in order to provide a high reliability system.

The invention is to use a word line to floating gate coupling effect to realize margin read.

FIG. 7 shows a cross section of a typical NAND memory array string, typically having sixteen NAND cells or thirty-two NAND cells. However in other specific implementations, there can be any number of memory cells in the NAND string. For example, there may be 4, 8, 10, 14, 20, 24, 36, 40, 48, 64, 88, 128, or more cells in a single NAND string.

The NAND string has memory cells 709 are formed in a p-well 713. Among other techniques, the p-well may be formed by depositing an epitaxial layer on a silicon wafer. The p-well is formed in an n-well 715 formed on a p-type substrate 705. The substrate is a silicon wafer. The memory cells are floating gate memory cells, each having a polysilicon control gate (word line), a polysilicon floating gate beneath the control gate, and diffusion regions 716 in the p-well. The word lines connected to the memory cell transistors are labeled WL0, WLn−1, WLn, WLn+1, and so forth.

At one end of the NAND cell string is a drain select transistor (labeled by SGD) and at the other end is a source select transistor (labeled by SGS). The SGS transistor is between memory transistor WL) and a source line 719 of the NAND string. And the SGD transistor is between a memory cell and a bit line 722. The bit line is connected up to metal-1 bit line (BL) through conductors, vias, and contacts. Region 729 is a region with silicon oxide. FIG. 7 shows an example of one cross section of a NAND array for illustration purposes. There are many possible cross section configurations for a NAND array and the principles of the invention would also apply to these other configurations with any necessary modifications.

FIG. 8 shows a circuit diagram of a NAND string of memory cells and one cell 802 to be read or verified. The figure shows the bias conditions during a read operation as well as the bias conditions during a program verify operation. During a read operation, a Vwl voltage of 0 volts is applied to the word line of a memory cell (WLn) 802 to be read. A Vread voltage, typically 4 volts or 5 volts, is applied to the word lines of other cells in the NAND string to turn those cells on, regardless of state—whether programmed or erased. Under these bias conditions, we can determine whether the VT of memory cell 802 is larger or smaller than 0 volts.

Similarly, during a program verify operation, a Vverify voltage is applied to the word line of memory cell (WLn) 802 that is to be read while the same Vread voltage as used for the read operation is applied to the other word lines of the NAND string. Notice the WL voltage on the surrounding or neighboring cells is the same for both read and verify operations. The difference in voltage between Vwl and Vverify ensures the proper margin during programming.

FIG. 9 shows a cross section of the memory cells of a NAND string and coupling capacitances 905 and 907 between a memory cell 802 to be read or verified and adjacent cells in the string. As devices scale down because of improvements in process technology and lithography, the effect of the coupling capacitances will become greater because the oxide thicknesses become thinner (i.e., distance between the capacitor plates). In fact, part of the measure floating gate voltage at the selected memory cell to be read or verified is coupled to that memory cell from the adjacent word lines.

When reading the selected memory cell (WLn), its threshold voltage or VT is determined by the amount of charge stored on its floating gate. But it is also a function of the voltage on the adjacent word line, since that voltage will coupled to the floating gate. So when different Vread voltages are used, the measured VT distribution will shift up or down in parallel. What this means is that, by changing the Vread value, one can "move" the measured VT distribution in both directions, thus obtaining a method of detecting the VT at different margins, even for cells with VT less than 0 volts. This is true for both binary and multistate memory cells. In an specific embodiment, with the appropriate Vread voltages on the word lines of adjacent memory cells, the VT may be shifted about up to about 100 millivolts.

During a margin read operation, one issue with NAND memory cells is read disturb of the erased cell. In other words, when reading a particular memory cell, the VTs of other erased cells are unintentionally altered or "disturbed." It is desirable to be able to detect a cell that has VT close to 0 volts. For example, a memory cell is about to cause failure if it's VT is, say, −0.100 volts. If we can detect such cells early during testing, then corrective actions can be taken and an error is avoided. Now by using the principle described above, we can apply a different Vread voltage, different from the Vread used during normal read and verify, then such bits can be detected. For example, if a Vread of −1 volts is applied to all other word lines (other then the selected cell) in the NAND string, the marginal cells will appear to have a higher VT, and thus we can detect them. A practical method is described below.

During read scrub, instead of using a normal Vread, issue special command to put the device in a test mode where different Vread voltages are permitted. Thus, using this approach, it will be possible to detect bits that have poor margin and are close to fail. Scrub is described in more detail in U.S. Pat. No. 5,532,962 and is incorporated by reference.

An error recovery method is as follows: During normal read, when a two-bit error correction code (ECC) error (for example, for binary NAND) is encountered, change the Vread voltage to recover the data. Typical voltages for Vread will be above about 4.5 volts to about 5.5 volts because this is the voltage need to turn on the device. The voltage range for Vread may be from, for example 5 volts to 9 volts, if it is desired to shift the VT up. The voltage range for Vread may be from, for example 5 volts to 2 volts, if it is desired to shift the VT down.

When Vread is changed, in most cases at least one or both of the failed bits will be recovered. By changing the Vread, the VT of the memory cell will be shifted by about 100 millivolts due to a capacitive coupling effect from the adjacent memory cells.

In a specific implementation, after the data is recovered, data of the entire block with the memory cell error is copied to another location. The block is marked as bad. This is done because it is likely there are some other memory cell or bits in the block that are physically degraded.

The error recovery technique may be implemented in the storage system in the controller of the memory. For example, during use, the controller detects the marginal cells and recovers the data from these cells by the VT shift technique described above. Once the data is recovered, the cells are marked as being bad, and other memory cells are found to place the data. The other memory cells where the data is moved to may be spare or redundant cells, or just other memory cells of the memory integrated circuit.

The technique may also be used during the testing of the device to improve the yield of the number of good dies. For example, a particular memory integrated circuit may have some marginal cells. The technique of the present invention would be used to map these bad cells from being used, and in their place, other spare or redundant cells are used.

The VT shift recovery technique may be used in conjunction with other memory cell error recovery technique such as ECC. VT shift recovery may be used in the case when ECC is not able to recover data from a marginal memory cell. Using the VT shift recovery technique, this will improve greatly the longevity and reliability of a storage system. It will provide an additional recovery technique when ECC or another technique is not effective.

A further improvement is as follows: As shown in FIGS. 8 and 9, to shift the VT of a selected memory cell, it only necessary to adjust the Vread on the two adjacent word lines to the selected memory cell. The Vread on the other word lines are not important. Therefore it may be more efficient to just change the Vread of the only two adjacent word lines instead of every other word line on the NAND string. This may either reduce extra read disturb or maintain enough head room to turn on the other cells.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. A memory system, comprising:
    an array of re-programmable non-volatile memory cell charge storage elements,
    a plurality of control lines extending across the array, individual control lines being field coupled with both a plurality of charge storage elements thereunder and another plurality of charge storage elements under control lines adjacent thereto,
    a reading circuit that reads the states of the charge storage elements under an addressed control line by applying a read voltage to the addressed control line and either a second or third voltage to the control lines adjacent thereto, the second and third voltages being different from each other, and
    a controller operably connected with the control lines and the reading circuit to cause data to be read from the charge storage elements under the addressed control line while the second voltage is applied to the adjacent control lines and to check the read data for error, and, as a response to discovery of an error in the read data, to cause the data to then be re-read from the charge storage elements under the addressed control line with the third voltage applied to the adjacent control lines.

2. The memory system of claim 1, wherein the reading circuit reads one of more than two states of the charge storage elements, thereby reading more than one bit of data in the individual charge storage elements.

3. The memory system of claim 1, wherein the memory cell array includes a plurality of strings of series connected memory cells and the control lines individually extend across one storage element of each of a plurality of strings.

4. The memory system of claim 3, wherein the controller operates to apply the second or third voltage to the control lines closest to the addressed control line and on opposite sides thereof.

5. The memory system of claim 1, wherein the third voltage is greater than the second voltage by at least 0.25 volt.

6. The memory system of claim 1, wherein the controller operates to check the read data for error by use of an error correction code.

7. The memory system of claim 6, wherein the controller, if the check discovers an error in the read data, utilizes the error correction code to correct the read data if the error correction code is able to do so but if the error correction code is unable to correct the errors then causes the data to be re-read from the charge storage elements under the addressed control line with the third voltage applied to the adjacent control lines.

8. The memory system of claim 1, wherein the charge storage elements are conductive floating gates.

9. A method of reading data stored as levels of charge in a plurality of re-programmable non-volatile memory cells, comprising:
    initially reading the data stored in a first group of a plurality of memory cells by applying a read voltage to gates of the memory cells of the first group, and applying a second voltage to gates of the memory cells of a second group located adjacent the first group in order not to read the data stored in the memory cells of the second group,
    checking the data read from the first group of memory cells for any data errors by use of an error correction code, and
    in response to any data error,
        (a) if the error correction code is able to recover the correct data, utilizing the error correction code to correct the data error, or
        (b) if the error correction code is unable to recover the correct data, re-reading the data stored in the memory cells of the first group of memory cells by applying a third voltage to gates of the memory cells of the second group that is different from the second voltage in order to alter threshold voltages of the memory cells of the first group on account of field coupling between memory cells of the first and second groups.

* * * * *